United States Patent [19]
Makita et al.

[11] Patent Number: 5,585,224
[45] Date of Patent: Dec. 17, 1996

[54] METHOD OF PRODUCING APERTURE GRILL

[75] Inventors: Akira Makita; Osamu Nakamura; Takeshi Ikegami; Yasuhiko Ishii, all of Tokyo, Japan

[73] Assignee: Dai Nippon Printing Co., Ltd., Japan

[21] Appl. No.: 277,641

[22] Filed: Jul. 20, 1994

[30] Foreign Application Priority Data

Jul. 21, 1993 [JP] Japan .................................. 5-200153

[51] Int. Cl.$^6$ ........................................... G03C 5/00
[52] U.S. Cl. .................... 430/323; 430/316; 430/318; 430/324; 216/47; 216/48; 216/33
[58] Field of Search ...................... 430/323, 318, 430/324, 316; 156/644, 664

[56] References Cited

U.S. PATENT DOCUMENTS

| | | | |
|---|---|---|---|
| 4,662,984 | 5/1987 | Ohtake et al. | 430/23 |
| 4,689,114 | 8/1987 | Ohtake et al. | 430/312 |
| 5,200,025 | 4/1993 | Toei et al. | 156/640 |
| 5,348,825 | 9/1994 | Nakamura et al. | 430/323 |

FOREIGN PATENT DOCUMENTS

| | | |
|---|---|---|
| 0291929 | 11/1988 | European Pat. Off. . |
| 0476664 | 3/1992 | European Pat. Off. . |
| 0521721 | 1/1993 | European Pat. Off. . |
| 61-130492 | 6/1986 | Japan . |
| 5-12996 | 1/1993 | Japan . |
| 5-28912 | 2/1993 | Japan . |

*Primary Examiner*—George F. Lesmes
*Assistant Examiner*—Laura Weiner
*Attorney, Agent, or Firm*—Parkhurst, Wendel & Burr, L.L.P.

[57] ABSTRACT

A method of producing an aperture grill of a CRT display device is disclosed. The aperture grill is of a small thickness of the order of 20 to 100 µm. To a metal plate with front and rear surface resin layers are applied front slit pattern mask with a single broad slit pattern and a rear slit pattern mask with two adjacent, narrow slit patterns. With these two masks disposed in opposition, the slit patterns are printed and developed on the resist layers. Thereafter, etching is carried out on the rear surface of the metal plate via the rear resist layer, and rear cavities are formed in the metal plate. Then, a reinforcing, etchant-proof film is attached to the rear resist layer to cover the rear cavities, and thereafter etching is carried out on the front surface of the metal plate via the front resist layer, to thereby form a front cavity. As the front etching proceeds, the front cavity is caused to communicate with the rear cavities with the etchant flowing into the rear cavities, and the front and rear cavities are made into a single through slit. Thereafter the reinforcing film is removed. The method makes it possible to easily produce slits of dimensional accuracy.

11 Claims, 2 Drawing Sheets

METHOD OF PRODUCING APERTURE GRILL

BACKGROUND OF THE INVENTION

The present invention relates to a method of producing a shadow mask of a television, and, more particularly, to a method of producing an aperture grill of a thickness of from 20 to 100 μm, for example, used typically in a Trinitron (Trademark of Sony Corporation) cathode ray tube (CRT).

In recent years, CRT display devices such as color televisions have become large in size, so that shadow masks used in such devices are required to be of large size as well. Particularly, in the type of shadow masks called aperture grills having vertical slits, the manner of fixing the same is different from the manner of fixing other types of shadow masks having other types of slits or circular openings. That is, the aperture grill is fixed under tension to a rigid frame. For this reason the frame must necessarily be enlarged in relation to the enlarged aperture grill and is required to resist the tension necessary for the fixing of the aperture grill of the conventional thickness. As a consequence, the weight of the frame is increased remarkably. In order to cope with this increase in the weight of the frame, the weight of the aperture grill must be reduced so that the thickness of the aperture grill will have to be reduced to compensate for the enlargement of the size.

The thickness of conventional shadow masks having slits or circular holes, including aperture grills having vertical slits, was in general more than 100 μm, and a known method for producing such shadow masks was to carry out concurrent etching of a metal plate on the opposite sides thereof to produce through holes. This method is called a one-step etching method.

Another known method for producing a shadow mask was as follows. That is, a metal plate is applied with resin layers on the opposite front and rear surfaces thereof, and then pattern masks are applied to the opposite resin layers. A front pattern mask has one broad slit pattern and a back pattern mask has two adjacent narrow slit patterns. Subsequently, the front and rear pattern masks are printed to the front and rear resist layers, respectively, by exposure to light, and then developments on the resist layers of the printed front and rear patterns are made.

A half-etching is carried out on the rear surface of a metal plate through the developed rear resist layer to form adjacent narrow rear recesses in the rear surface of the plate. Then an etchant-proof resin is filled into the rear recesses and over the rear resin layer on the metal plate. Next a broad front recess is etched in the front surface of the metal plate through the developed front resist layer to cause the front recess to reach the half-etched rear recesses, whereby a through hole is produced in the metal plate. This method is a two-step etching method and is described in Japanese Patent Appln. Laid-Open (Kokai) No. 61-130,492 published Jun. 18, 1986.

Japanese Patent Application Laid-Open (Kokai) No. 5-28912 published Feb. 5, 1993 discloses a further method, using a front pattern mask having a broad slit pattern, and a rear pattern mask having two narrow slit patterns. This method aims at controlling the cross-sectional shapes of etched recesses and therefore the cross-sectional shape of the finally obtained through hole or slit.

Another method for producing a shadow mask is disclosed in Japanese Patent Application Laid-Open (Kokai) No. 5-12,996 published Jan. 22, 1993. In this method, a metal plate is applied with resist layers on the front and rear surfaces thereof, and then a pattern slit mask is applied to only the front surface and printed to the same by exposure to light, while the rear resist layer is maintained as it is and backed up by a backup resin sheet. Etching is carried out on only the front surface of the metal plate through the printed and developed front resist layer to produce a front recess in the metal plate. The front recess reaches the rear resist layer, whereby a through hole is produced in the metal plate when the rear resist layer is removed together with the backup resin sheet.

The above stated known methods are for shadow masks of the conventional thickness of more than 100 μm and cannot be used for thin shadow masks of a thickness of from 20 to 100 μm for the following reasons.

Shadow masks are required to have not only dimensional precision but also precise shape control of the through holes to be formed. However, it is considered difficult to attain these requirements in the case of thin shadow masks. Shadow masks of any type, including aperture grills having vertical slits, used for CRT displays such as color televisions, have a function to control scanning of the electron beams within the cathode ray tube. Any type of shadow mask is a mask for selecting the electron beams, and the through holes or slits of the shadow masks are required to have a predetermined shape and taper of the internal side walls for allowing passage of the beams of selected angles. However, it has been difficult to produce through holes and slits having tapered side walls of strictly required tapering configuration.

More specifically, if the previously described one-step etching method wherein the front and rear side etchings are carried out concurrently is used for a thin metal plate of a thickness of from 20 to 100 μm, the thin metal plate cannot withstand the spraying force within the etchant bath and tends to warp, losing its planar shape so that working precision drops.

In the case of use of the previously described two-step etching method for a thin metal plate of a thickness of from 20 to 100 μm, the thin metal plate tends to be deformed during the filling of the resin so that the resin filling operation is time-consuming and troublesome.

When the one-side etching method disclosed in Japanese Patent Appln. Laid-Open (Kokai) No. 5-12,996 is used for a thin metal plate mentioned above, an etching quantity equivalent to that of a plate of double or triple thickness is required, and moreover it is difficult to produce a desired configuration of the through holes or slits with a resultantly obtained reduced degree of taper. If the etching quantity is reduced to secure a desired degree of taper, the degree of linearity of the side walls of the produced through holes or slits deteriorates so that dimensional precision of the holes or slits drops. Especially, in the case of production of aperture grills of a thickness of the order of 20 to 100 μm, the slit shape becomes unstable at the instant of the breakthrough of the slit so that dimensional precision drops considerably and a desired degree of taper can hardly be obtained. When dimensional precision drops, there occurs non-uniform brightness when the aperture grill is seen through its slits and irregular depressions tend to be formed in the grill.

SUMMARY OF THE INVENTION

It is an object of the present invention to provide a method of producing an aperture grill of a cathode ray tube whereby a thin metal plate of a thickness of from 20 to 100 μm can be processed to have slits of precise dimensional configuration.

In order to attain the above object, the present invention provides a method of producing an aperture grill comprising the steps of: providing a metal plate of a thickness of from 20 to 100 μm; applying front and rear photosensitive resist layers to front and rear surfaces of the metal plate, respectively; applying front and rear slit pattern masks to the front and rear resist layers, respectively; printing the front and rear slit pattern masks to the front and rear resist layers, respectively; developing printed slit patterns in the front and rear resist layers; half-etching at least the rear surface of the metal plate through the rear resist layer to produce rear recesses; attaching an etchant-proof film to the rear resist layer so as to cover the etched recesses in the rear surface of the metal plate, said etchant-proof film having an adhesiveness which will be reduced upon being subjected to a treatment; etching the front surface of the metal plate through the front resist layer to produce a front recess; causing the front recess to communicate with the rear recesses as the etching of said front surface proceeds; causing an etchant acting on the front recess to flow into the rear recesses while preventing the etchant in the rear recesses from flowing past the rear recesses by means of the etchant-proof film, when the front recess is caused to communicate with the rear recesses; carrying out further etching of both the front and rear recesses as well as a boundary region between the front and rear recesses to provide a through slit having a desired configuration; subjecting said etchant-proof film to the treatment to reduce the adhesiveness thereof, thereby removing the film from the rear resist layer; and removing the front and rear resist layers from the metal plate.

A preferred embodiment of the invention will be understood from the following detailed description with reference to the accompanying drawings.

DESCRIPTION OF A PREFERRED EMBODIMENT

Figure 1:
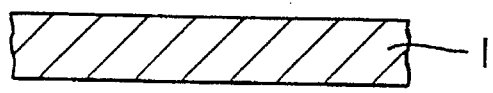
FIG. 1 is a sectional view of a metal plate to which the method of the present invention is applied.

Referring to FIG. 1, a metal plate 1 such as a low carbon steel plate is first prepared for producing an aperture grill.

Figure 2:
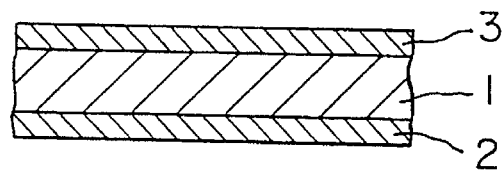
FIG. 2 is a sectional view showing the metal plate applied with resin layers on the opposite surfaces thereof.
Figure 3:
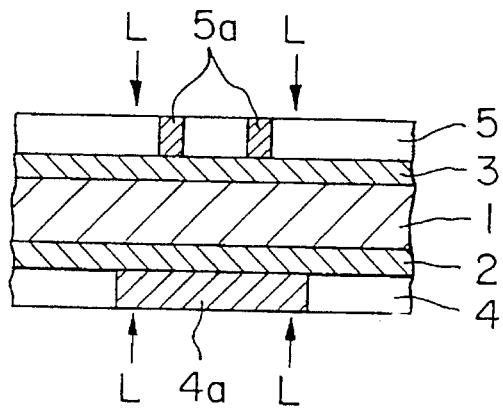
FIG. 3 is a sectional view showing a step in which slit pattern masks are applied and printed on the resin layers.

The metal plate 1 has a thickness of 20 to 100 μm. Then, as shown in FIG. 2, a photosensitive material is applied to the opposite surfaces of the metal plate 1 to form front and rear resin layers 2 and 3, which are then dried. In the embodiment shown, the lower side in the drawings is a front side and the upper side is a rear side. On the front side of the front resist layer 2 is applied a front pattern mask 4, and on the rear side of the rear resist layer 3 is applied a rear pattern mask 5, as indicated in FIG. 3.

Thereafter, exposure to light of the photosensitive resist layers 2 and 3 is carried out through the masks 4 and 5, respectively, as indicated by arrows L. The front mask 4 has a light-intercepting pattern slit 4a of a width corresponding to the width of a slit which is to be formed through the metal plate 1. The rear mask 5 has two adjacent light-intercepting pattern slits 5a of a small width. These two slits 5a are disposed in parallel in opposition to the pattern slit 4a within the width of the same, as shown. As a result of the exposure to light, the pattern slits 4a and 5a are printed on the resin layers 2 and 3, respectively. In the embodiment, the resin layers 2 and 3 are shown as photosetting layers.

Figure 4:
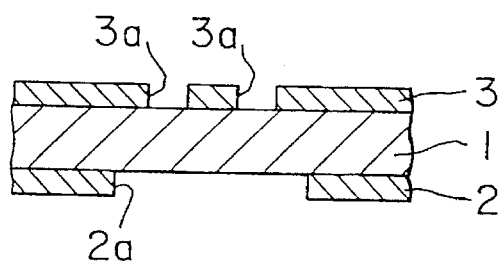
FIG. 4 is a sectional view showing a step after slit pattern printing and development.
Figure 5:
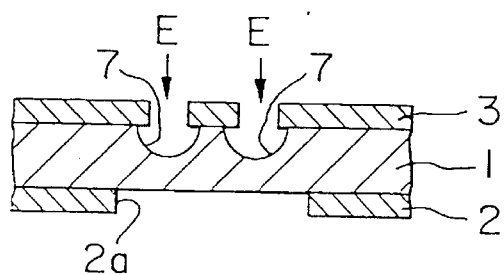
FIG. 5 is a sectional view showing a step of rear etching.

After removal of the masks 4 and 5 and development of the printed pattern slits, the front resin layer 2 is caused to have a single slit 2a, while the rear resin layer 3 is caused to have two parallel slits 3a, as shown in FIG. 4. Then, as shown in FIG. 5, the metal plate 1 is subjected to etching as indicated by arrows E on the back side. As a result, half-etched rear recesses 7 are formed in the rear surface of the metal plate 1, which is then washed and dried.

Figure 6:
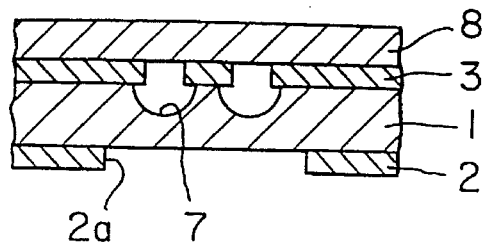
FIG. 6 is a sectional view showing a step of applying an etchant-proof film.

Thereafter, as shown in FIG. 6, an etchant-proof film 8 is applied to the rear side of the rear resin layer 3 to close the recesses 7. Then, the metal plate 1 is subjected to etching from the front side as indicated by arrows E in FIG. 7, whereby the metal plate 1 is formed with a front recess 9 in the front of the plate 1, which recess 9 is enlarged and finally reaches the rear recesses 7. As the etching progresses and the front recess 9 is enlarged further, a through slit 10 is obtained as shown in FIG. 8.

Figure 7:
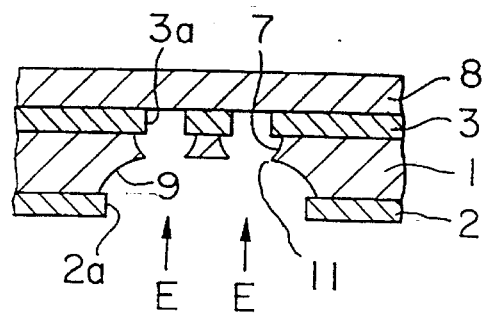
FIG. 7 is a sectional view showing a step of front etching.
Figure 8:
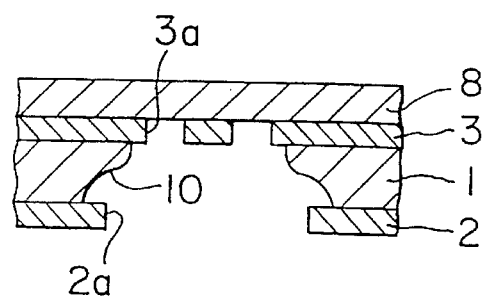
FIG. 8 is a sectional view showing progress of the step of FIG. 7.

For carrying out the above stated front etching process shown in FIGS. 7 and 8, the etchant-proof film 8 applied to the rear side of the layer 3 serves to allow the etchant to flow from the front side into the rear recesses 7 without flowing past the recesses 7. Once the front recess 9 is enlarged and reaches the rear recesses 7, the etchant that has been acting on the surface of the front recess 9 begins to flow into the rear recesses 7, which then act as reservoirs for the inflowing etchant because of the film 8 provided behind the recesses 7. The rear recesses 7 and slits 3a retain therein the etchant, which makes circulating flows and promotes etching of the rear recesses 7 as well as an inwardly protruding boundary region 11 between the front and rear recesses 9 and 7. The etching of the boundary region 11 is carried out quickly so that the protruding region 11 disappears soon so as to form the through slit 10 (FIG. 8).

The formation of the through slit 10 is carried out together with the progress of the etching of the front recess 9. Such concurrent progresses of the etching of the front and rear recesses are accompanied by side etching of these recesses so that the widths of these recesses are increased. Because of the concurrent progresses of the etching of the front and rear recesses, the shape and hence the internal taper of the through slit 10 can be suitably adjusted by selecting the widths of the slits 4a and 5a of the pattern masks and the spacing between the adjacent slits 5a.

It has been found that use of only one rear pattern slit 5a in relation to the single front pattern slit 4a results in difficulty in controlling the half-etching of a rear recess, sometimes leading to full etching that undesirably forms a through slit. It has been confirmed that the use of two or more adjacent rear pattern slits 5a in relation to a single broad, front pattern slit 4a is advantageous to produce a through slit 10 having a well controlled shape and tapering side walls. When the through slit 10 has a rear opening width (smaller width) on the order of 180 μm, the use of two rear pattern slits 5a is desirable.

Figure 9:
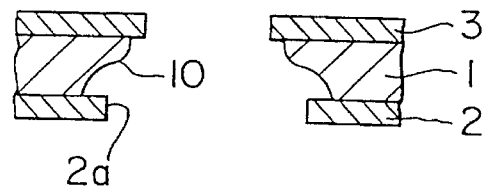
FIG. 9 is a sectional view showing a step after removal of the etchant-proof film.
Figure 10:
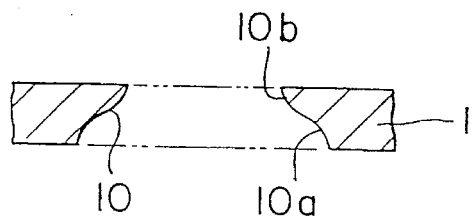
FIG. 10 is a section of the metal plate having a through slit formed therein.

After the through slit 10 having opposite side walls of controlled taper and shape has been produced in the manner described above, the film 8 shown in FIG. 8 is removed so that the state shown in FIG. 9 is obtained. Thereafter, the front and rear resist layers 2 and 3 are removed to leave a metal plate 1 having the through slit 10 as shown in FIG. 10. It will be noted that the thus obtained through slit 10 has a concave, front side wall portion 10a and a convex, rear side wall portion 10b, these portions 10a and 10b being smoothly connected to each other. It is to be noted that the through slit 10 has a larger front opening and a smaller rear opening.

The etchant-proof film 8 described before is an acid proof film having a reinforcing capability and being attachable to the photosensitive resin layers 2 and 3. The film 8 has an adhesiveness (or tackiness) relative to the resin layer, and the adhesiveness must be one that will be reduced when a treatment is applied thereto. The treatment is, for example, thermosetting treatment, thermofoaming treatment, ultraviolet light irradiation, heating, cooling, and so on. The etchant-proof film is, for example, a film consisting of a base film of polyester resin and a tacky layer on the base film, made of a resin, such as an epoxy resin, curable by ultraviolet ray irradiation. An example of UV (ultraviolet ray) curable resin is ELEPHOLDER SM-3061 (tradename of Nitto Denko Kabushiki Kaisha, Japan) which is an acrylic resin. When thermofoaming is used as the treatment, the tacky layer contains therein microcapsules in which a powdery material is filled. When the tacky layer is heated, the microcapsules are swelled and bursted so that the tackiness of the layer is reduced. When cooling is used as the treatment, the tacky layer may be formed of a crystalline material having crystal orientation that changes depending upon temperature. Such a tacky layer has a tackiness at, for example, 60° C., and the tackiness is reduced considerably at 25° C.

Because of the tackiness the film 8 is sealingly attached to the surface of the rear resist layer 3 as shown in FIG. 6 when the film 8 is pressed against the resist layer 3. The thus attached film 8 serves to maintain the rear sides of the rear recesses 7 liquid-tight and to reinforce the rear side, preventing the etchant in the rear recesses 7 from leaking rearwardly out of the rear recesses. Particularly, as the etching proceeds, the recesses 7 and 9 are enlarged and the metal plate 1 in the region of these recesses becomes weak, so that it becomes more and more difficult to maintain the planar state of the plate 1. The film 8 serves to reinforce the thus weakened plate by backing it up, so as to maintain the planar state of the plate. The film 8 performs the function of reinforcing the metal plate even during and after the formation of the through slit 10 shown in FIG. 8. Thus, the film 8 provides the advantage of preventing generation of defects such as lowering of dimensional accuracy of the slits formed due to unstableness of maintaining the planar state of the metal plate 1, and white or black lines and non-uniform brightness that are observed when the produced aperture grill is seen through the slits thereof because of non-uniform width of the slits produced.

When a reinforcing film having an adhesive layer curable by ultraviolet light irradiation is used, the film in the attached state as shown in FIG. 8 can be removed easily by simply irradiating ultraviolet rays. By this irradiation, the adhesive layer of the film is cured or hardened with resultant lowered adhesiveness. The removal of the film can thus be carried out easily after the etching steps have been completed. The ultraviolet ray irradiation is simple and easy and does not cause any influence on the quality of the aperture grill thus produced. Thereafter comes the removal of the front and rear resist layers.

EXAMPLE

An elongated low carbon steel plate (1) of a thickness of 50 μm was prepared, and casein resist layers (2) were applied to front and rear surfaces of the plate and dried thereafter. On the front and rear surfaces of the plate were applied a front pattern mask (4) and a rear pattern mask (5), respectively. Then, exposure to light and subsequent development were carried out. The front pattern mask (4) had a single broad slit pattern (4a) of a width of 210 μm, while the rear pattern mask (5) had two parallel, narrow slit patterns (5a) of a width of 20 μm with a spacing 110 μm between the two patterns. Such slit pattern (4a) and slit patterns (5a) were placed on opposite sides of a location of the plate (1) at which a through slit (10) is to be formed.

Then the rear surface of the plate was subjected to a spray etching operation through the rear resist layer 5. As an etchant was used an etching liquid of ferric chloride of a specific gravity of 46 Baumé degree and of a temperature of 60° C. The etching was stopped at a depth of approximately 20 μm, and washing and drying were carried out.

A reinforcing etchant-proof film (8) was applied to the rear resist layer (3) in sealing contact therewith. The film had a polyester resin film of a thickness of 50 μm, bearing thereon a tacky layer of a resin capable of being cured by ultraviolet light. Thereafter, etching was carried out on the front surface of the plate (1) through the front resist layer (2), using the above mentioned ferric chloride etching liquid. The front side etching was stopped in a specific time interval.

After washing and drying, ultraviolet light was irradiated to the entire surface of the rear resin layer to cure the tacky layer to become less tacky. Thereafter, the reinforcing film (8) was removed, and the resist layers (2 and 3) were removed with an alkaline solution. After washing and drying operations, an aperture grill having through slits (10) was produced. Each of the produced through slits had a rear slit width of 170 μm, a front slit width of 260 μm, a degree of taper of approximately 45 μm. There were no problems concerning the dimensional accuracy, and generation of black and white lines and non-uniformity in brightness when viewed through the grill.

Under exactly the same conditions, an etching was also carried out on a low carbon steel plate of a thickness of 35 μm to produce an aperture grill, and comparisons were made with an aperture grill that was produced by the conventional one-side etching method. The results of the comparisons are shown in the following table.

TABLE

| METHOD | PLATE THICK- NESS | DEGREE OF TAPER (μm) | DIMEN- SIONAL ACCUR- ACY (σ) | LINEARITY (μm) | |
|---|---|---|---|---|---|
| | | | | Rz | $R_{MAX.}$ |
| 1 CONVEN- TIONAL | 50 | 15 | 0.12 | 0.63 | 0.75 |
| INVEN- TION | 50 | 45 | 0.12 | 0.58 | 0.72 |
| 2 CONVEN- TIONAL | 35 | 10 | 0.28 | 0.76 | 0.94 |
| INVEN- TION | 35 | 30 | 0.17 | 0.60 | 0.76 |

As will be noted from the table, the method of the present invention makes it possible to have a degree of taper of more than two times of that obtainable by the conventional one-side etching method, provided that the linearity is taken at the same degree. Furthermore, the degree of taper, dimensional accuracy and linearity are at practical levels.

Here, the taper is defined as a value that is a half the difference between the larger and smaller slit widths, and the dimensional accuracy is defined as standard deviation (σ) of the smaller slit width. The values Rz and Rmax. representing the linearity are defined in the JIS (Japanese Industrial Standards), B0601-1982.

In the above example, the etching liquid had a temperature of 60° C., and a specific gravity of 46 Baumé degree. Similar methods were carried out at a temperature of 50° to 75° C. and with a specific gravity of 45 to 49 Baumé degree, and similar results to the foregoing were also obtained.

Under the same conditions described above, similar methods were conducted for a plate of a thickness of 20 μm, and similar results were obtained.

It will be understood from the above description that the method of the present invention makes it possible to produce aperture grills of a thickness of from 20 to 100 μm, which are stable in quality, in a relatively simple way compared with the conventional two-step etching method in which resin must be filled in etched cavities formed in advance.

What is claimed is:

1. A method of producing an aperture grill comprising the steps of:

providing a metal plate having a thickness ranging from 20 to 100 μm;

applying front and rear photosensitive resist layers on front and rear surfaces of the metal plate, respectively;

applying front and rear slit pattern masks on the front and rear resist layers, respectively;

forming slit patterns, represented by the patterns of the front and rear slit pattern masks, on the front and rear resist layers, respectively, by exposing the front and rear resist layers through the front and rear slit pattern masks, respectively;

developing the exposed slit patterns in the front and rear resist layers;

etching at least the rear surface of the metal plate through the rear resist layer to produce rear recesses;

attaching an etchant-proof film to the rear resist layer so as to cover the etched recesses in the rear surface of the metal plate, said etchant-proof film having reducible adhesiveness;

etching the front surface of the metal plate through the front resist layer to produce a front recess;

causing the front recess to communicate with the rear recess as the etching of said front surface proceeds;

causing an etchant acting on the front recess to flow into the rear recesses, while preventing the etchant in the rear recesses from flowing past the rear recesses by means of said etchant-proof film, when the front recess is caused to communicate with the rear recesses;

carrying out further etching of both the front and rear recesses as well as a boundary region between the front and rear recesses to provide a through slit having a desired configuration;

reducing the adhesiveness of said etchant-proof film to thereby remove the film from the rear resist layer; and removing the front and rear resist layers from the metal plate.

2. The method according to claim 1, wherein the front slit pattern mask has a single slit pattern and the rear slit pattern mask has at least two, adjacent slit patterns.

3. The method according to claim 2, wherein a lateral spacing between said at least two slit patterns is smaller than the width of said single slit pattern.

4. The method according to claim 1, wherein said etchant-proof film comprises a base film and an adhesive layer applied on the base film.

5. The method according to claim 1, wherein said enchant-proof film covers, but does not fill the etched recesses in the rear surface of the metal plate.

6. The method according to claim 1, wherein the adhesiveness of said etchant-proof film is reduced by a physical treatment.

7. A method according to claim 6, wherein said physical treatment includes heating and/or cooling.

8. The method according to claim 1, wherein the adhesiveness of said etchant-proof film is reduced by a chemical treatment.

9. The method according to claim 1, wherein the adhesiveness of said etchant-proof film is reduced by a thermosetting treatment.

10. The method according to claim 1, wherein the adhesiveness of said etchant-proof film is reduced by a thermofoaming treatment.

11. The method according to claim 1, wherein the adhesiveness of said etchant-proof film is reduced by an ultraviolet light irradiation treatment.

* * * * *